(12) United States Patent
Murata (10) Patent No.: US 11,088,667 B2
(45) Date of Patent: Aug. 10, 2021

(54) METHODS AND APPARATUS FOR A DUAL MODE OPERATIONAL AMPLIFIER

(71) Applicant: SEMICONDUCTOR COMPONENTS INDUSTRIES, LLC, Phoenix, AZ (US)

(72) Inventor: Tsutomu Murata, Mizuho (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 307 days.

(21) Appl. No.: 16/215,836

(22) Filed: Dec. 11, 2018

(65) Prior Publication Data

US 2020/0186110 A1    Jun. 11, 2020

(51) Int. Cl.
| | | |
|---|---|---|
| *H03F 3/45* | (2006.01) | |
| *H03F 3/68* | (2006.01) | |
| *H03F 3/217* | (2006.01) | |
| *G01P 1/00* | (2006.01) | |
| *G01P 15/00* | (2006.01) | |

(52) U.S. Cl.
CPC .................. *H03F 3/68* (2013.01); *G01P 1/00* (2013.01); *G01P 15/00* (2013.01); *H03F 3/2171* (2013.01); *H03F 3/45269* (2013.01); *H03F 2200/228* (2013.01); *H03F 2200/249* (2013.01)

(58) Field of Classification Search
CPC ...... H03F 3/68; H03F 3/45269; H03F 3/2171; H03F 2200/228; H03F 2200/249; H03F 3/45632; H03F 3/45928; H03F 2203/45514; H03F 2203/45551; H03F 3/45475; H03F 3/45192; H03F 3/45; G01P 1/00; G01P 15/00
USPC .................................................. 330/252–261
See application file for complete search history.

(56) References Cited

U.S. PATENT DOCUMENTS

| | | | | |
|---|---|---|---|---|
| 7,449,950 | B2 * | 11/2008 | Ivanov | ................. H03H 19/004 |
| | | | | 330/253 |
| 2016/0178442 | A1 | 6/2016 | Murray | |
| 2016/0308492 | A1 | 10/2016 | Ciubotaru | |

* cited by examiner

*Primary Examiner* — Hieu P Nguyen
(74) *Attorney, Agent, or Firm* — Noblitt & Newson, PLLC; Gary W. Newson (57) ABSTRACT

Various embodiments of the present technology comprise a method and apparatus for a dual mode operational amplifier. According to various embodiments, the operational amplifier functions as both a fully-differential amplifier and a single-ended amplifier. The operational amplifier may comprise additional transistors that function as switches, which can be selectively operated according to a desired mode.

20 Claims, 10 Drawing Sheets

METHODS AND APPARATUS FOR A DUAL MODE OPERATIONAL AMPLIFIER

BACKGROUND OF THE TECHNOLOGY

Many electrical systems utilize both a fully-differential amplifier and a single-ended amplifier that operate in conjunction with each other to provide different amplifying modes. For example, the fully-differential amplifier provides one mode of operation while the single-ended amplifier provides a different mode of operation. In conventional systems, in order to produce the various modes, two or more separate amplifier circuits are needed. In cases where chip space is limited, implementing two or more separate amplifier circuits may not be feasible. In addition, multiple amplifier circuits generally increase the overall cost of the device.

SUMMARY OF THE INVENTION

Various embodiments of the present technology comprise a method and apparatus for a dual mode operational amplifier. According to various embodiments, the operational amplifier functions as both a fully-differential amplifier and a single-ended amplifier. The operational amplifier may comprise additional transistors that function as switches, which can be selectively operated according to a desired mode.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various sensors, analog-to-digital converters, switch elements, logic circuits, signal generators, and the like, which may carry out a variety of functions. In addition, the present technology may be practiced in conjunction with any number of electronic systems, such as sensor systems or any other systems that require a fully-differential mode and a single-ended mode, and the systems described are merely exemplary applications for the technology.

Figure 1:
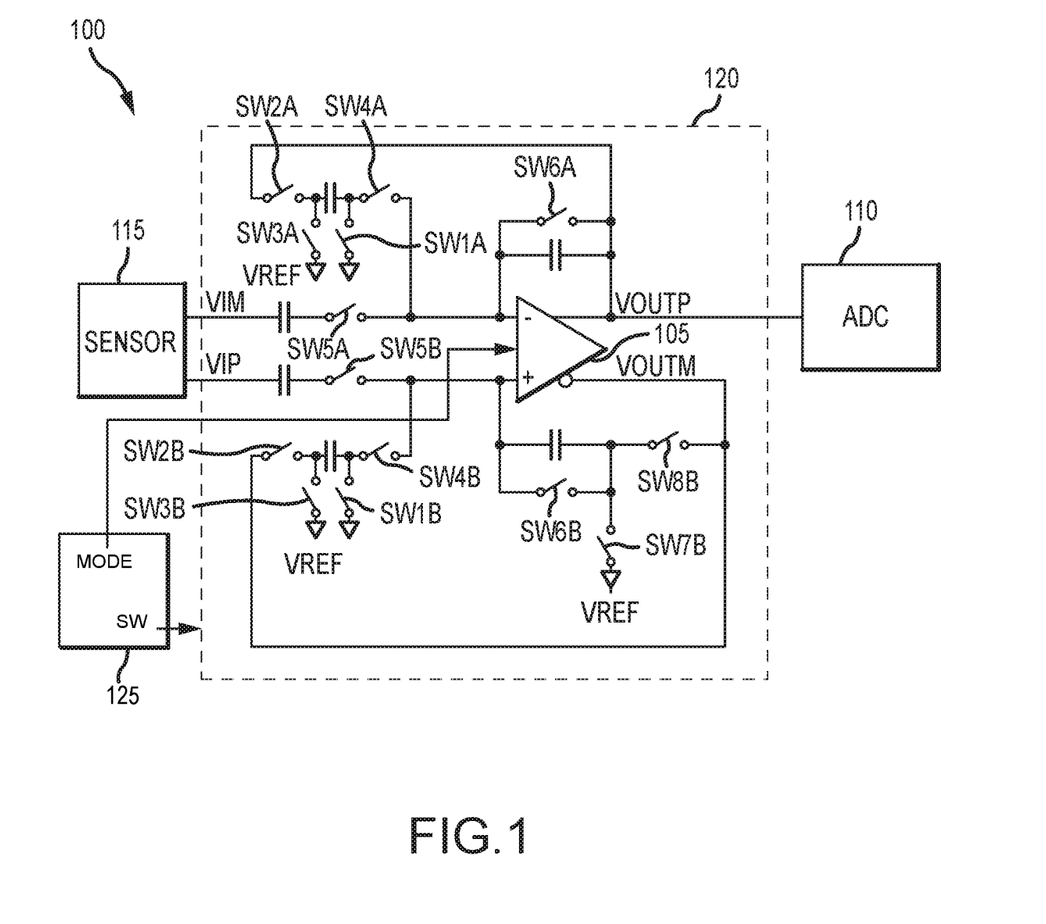
FIG. 1 is a diagram of a sensor system comprising an amplifier circuit with a dual mode operational amplifier in accordance with an exemplary embodiment of the present technology.

Methods and apparatus for a dual mode amplifier circuit according to various aspects of the present technology may operate in conjunction with any suitable sensor, such as an acceleration sensor or a gyro sensor, and any suitable analog-to-digital converter. Referring to FIG. 1, an exemplary sensor system 100 may comprise a sensor circuit 115, an amplifier circuit 120, and an analog-to-digital converter (ADC) 110 that together to amplify sensor signals and convert analog sensor signals into digital signals.

The sensor circuit 115 may generate various sensor signals. In some cases, it may be desired to amplify the sensor signals prior to processing the signals. For example, the sensor circuit 115 may comprise an acceleration sensor for generating acceleration signals. As the voltage of an acceleration signal may be quite low, processing such a low-voltage signal may be difficult unless the voltage is first amplified.

The amplifier circuit 120 may be configured to receive and amplify the sensor signals. According to an exemplary embodiment, the amplifier circuit 120 may comprise a plurality of switches, such as switches SW1A:SW6A and switches SW1B:SW8B, and an operational amplifier (op-amp) 105.

Figure 2:
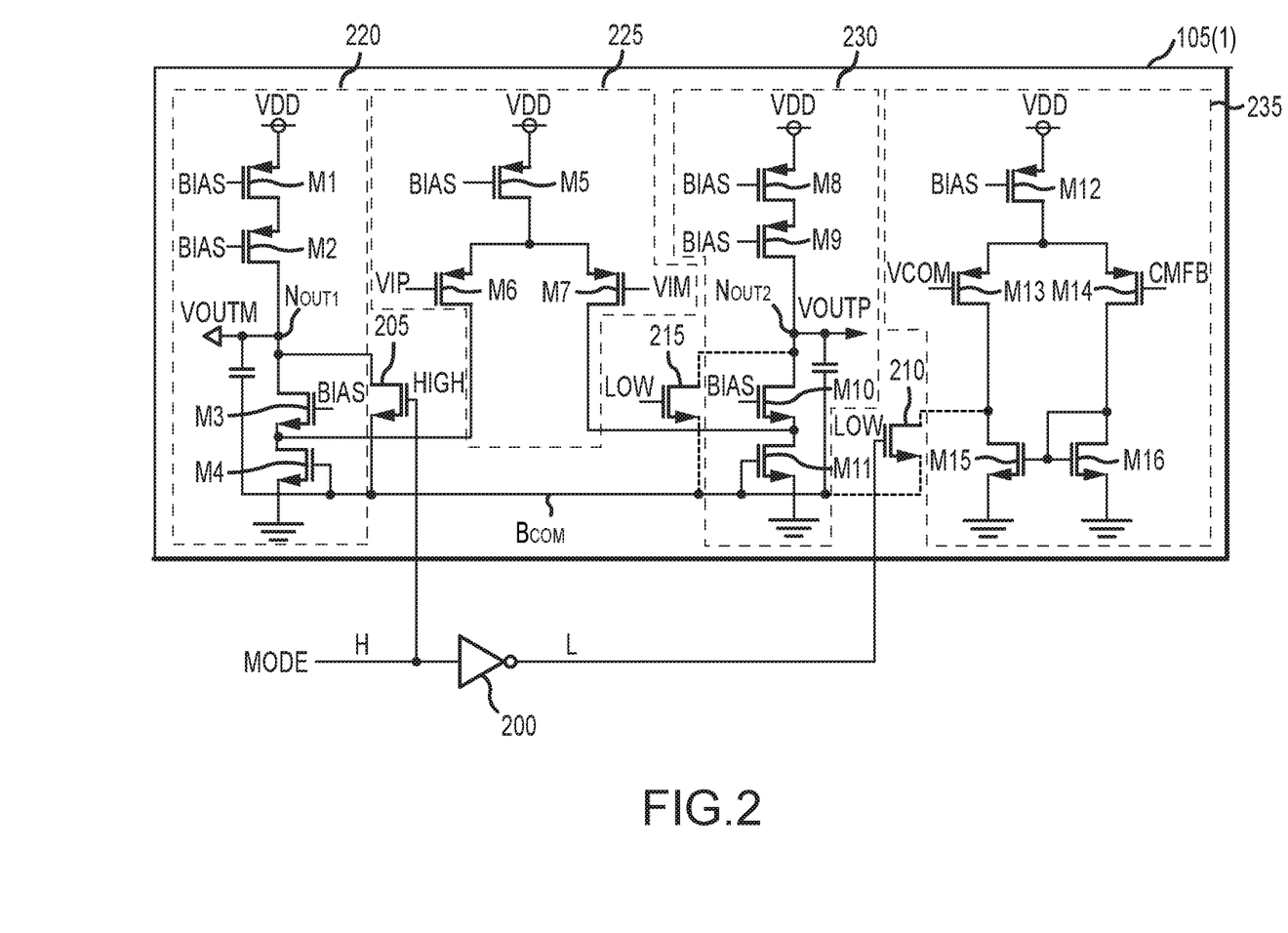
FIG. 2 is a first embodiment of the dual mode operational amplifier in a single-ended mode in accordance with an exemplary embodiment of the present technology.
Figure 3:
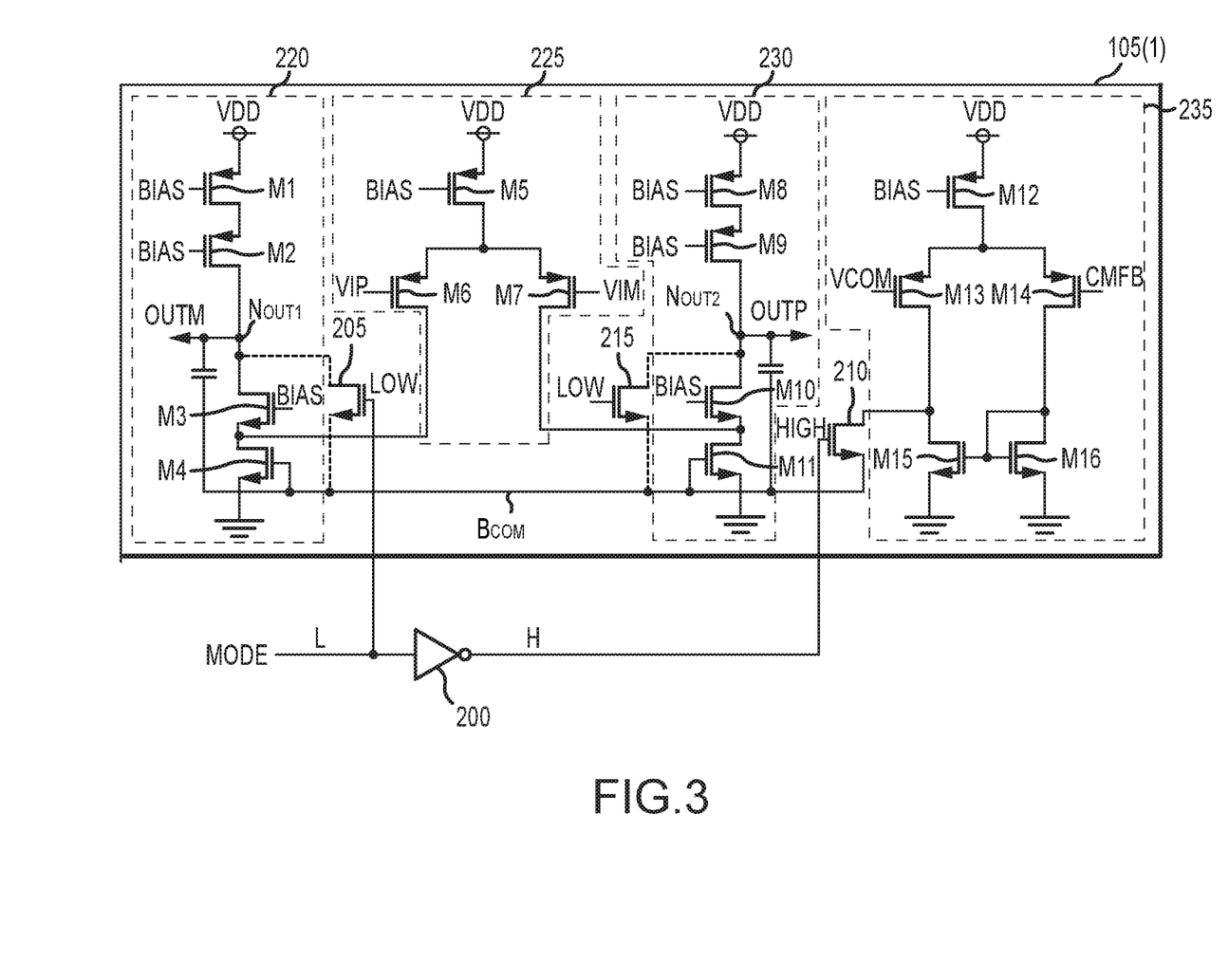
FIG. 3 is first embodiment of the dual mode operational amplifier in a fully-differential mode in accordance with an exemplary embodiment of the present technology.
Figure 4:
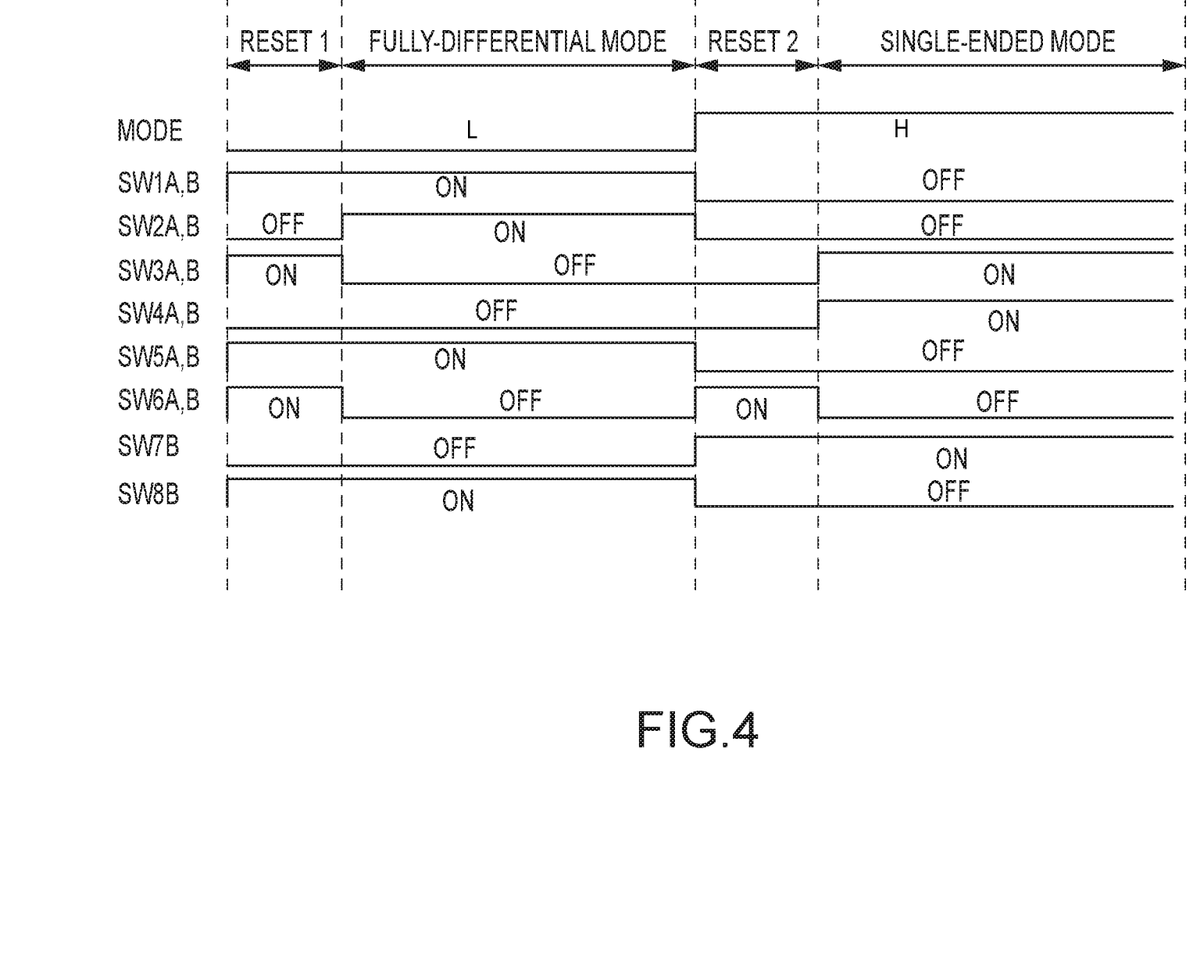
FIG. 4 is a timing diagram for operating the amplifier circuit in accordance with an exemplary embodiment of the present technology.
Figure 5:
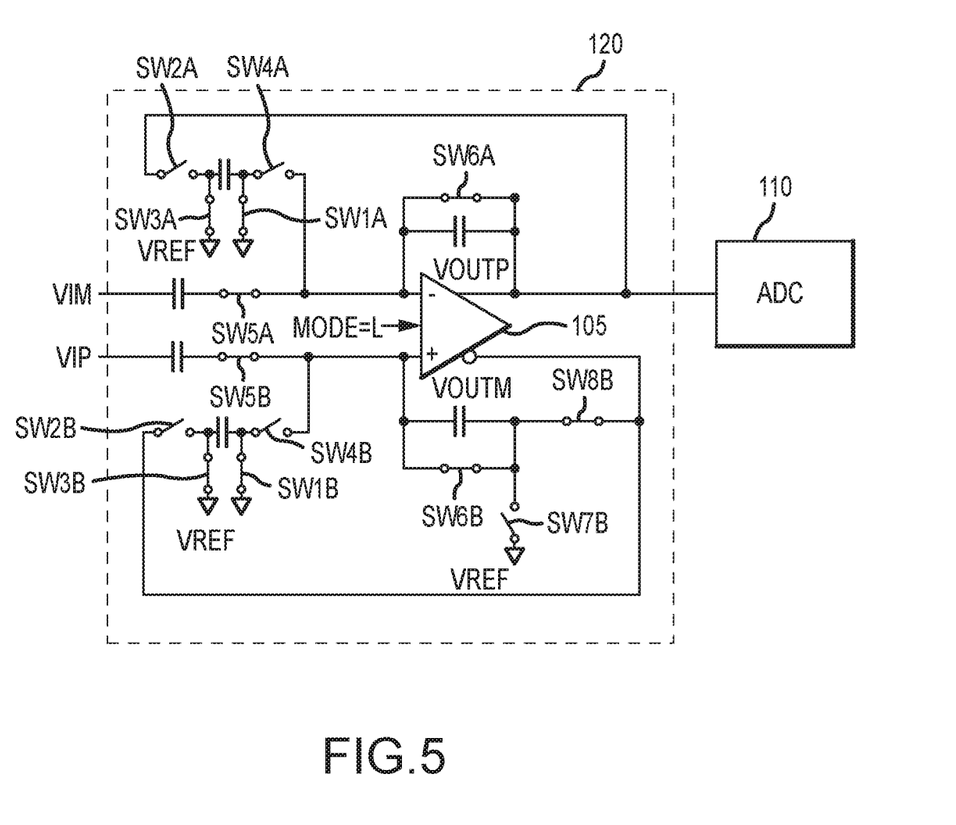
FIG. 5 is the amplifier circuit in a first reset phase in accordance with an exemplary embodiment of the present technology.

Referring to FIGS. 2 and 3, in a first embodiment, the op-amp 105(1) may be configured to operate in both a fully-differential mode and a single-ended mode. For example, the op-amp 105(1) may be configured to receive and respond to a mode signal, such as a high mode signal 'H' (i.e., a high voltage) and a low mode signal (i.e., a low voltage). According to an exemplary embodiment, the op-amp 105(1) may comprise a plurality of sub-circuits, such as a first sub-circuit 220, a second sub-circuit 225, a third sub-circuit 230, and a fourth sub-circuit 235, that are connected together and configured to amplify an input signal, such as a first input signal VIP and a second input signal VIM. According to the present embodiment, the first, third, and fourth sub-circuits 220, 230, 235 may be directly connected to each other via a bias node $B_{COM}$ and the second sub-circuit 225 may be connected directly to the first and third sub-circuits 220, 230. The op-amp 105(1) may further comprise a plurality of mode switch elements, such as a first mode switch 205 and a second mode switch 210, that are selectively enabled/disabled to operate the op-amp 105(1) in one of the fully-differential mode or the single-ended mode at any given time.

The first sub-circuit 220 may comprise a first plurality of transistors, such as a first transistor M1, a second transistor M2, a third transistor M3, and a fourth transistor M4. The first and second transistors M1, M2 may be connected in series. The first and second transistors M1, M2 may comprise p-channel transistors. A source terminal of the first transistor M1 may be connected to a supply voltage VDD and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise n-channel transistors. A drain terminal of the third transistor M3 may be connected to the first output node $N_{OUT1}$ and a source terminal of the fourth transistor M4 may be connected to a reference voltage, such as a ground. A gate terminal of the third transistor M3 may be connected to a bias voltage and a gate terminal of the fourth transistor may be connected to the bias node $B_{COM}$. The first output node $N_{OUT1}$ may also serve as a first output terminal for a first output voltage VOUTM.

The first mode switch 205 may comprise a transistor, such as an n-channel transistor. A drain terminal of the first mode switch 205 may be connected to the first output node $N_{OUT1}$, a source terminal of the first mode switch 205 may be connected to the bias node $B_{COM}$, and a gate terminal of the first mode switch 205 may be configured to receive the mode signal.

The second sub-circuit 225 may comprise a second plurality of transistors, such as a fifth transistor M5, a sixth transistor M6, and a seventh transistor M7. The fifth transistor M5 may comprise a p-channel transistor comprising a source terminal connected to the supply voltage VDD and a drain terminal connected to the sixth and seventh transistors M6, M7. A gate terminal of the fifth transistor may be connected to a bias voltage.

The sixth and seventh transistor M6, M7 may be connected in parallel with each other and in series with the fifth transistor M5. The sixth and seventh transistors M6, M7 may comprise p-channel transistors. Accordingly, source terminals of the sixth and seventh transistors M6, M7 may each be connected to the drain terminal of the fifth transistor M5. A gate terminal of the sixth transistor M6 may be connected to the first input voltage VIP and a gate terminal of the seventh transistor M7 may be connected to the second input voltage VIM. A source terminal of the sixth transistor M6 may be directly connected to the first sub-circuit 220, for example to the source terminal of the third transistor M3 and the drain terminal of the fourth transistor M4. A source terminal of the seventh transistor M7 may be directly connected to the third sub-circuit 230.

The third sub-circuit 230 may comprise a third plurality of transistors, such as an eighth transistor M8, a ninth transistor M9, a tenth transistor M10, and an eleventh transistor M11. The eighth and ninth transistors M8, M9 may be connected in series. The eighth and ninth transistors M8, M9 may comprise p-channel transistors. A source terminal of the eighth transistor M8 may be connected to the supply voltage VDD and a drain terminal of the ninth transistor M9 may be connected to a second output node $N_{OUT2}$. Gate terminals of each of the eighth and ninth transistors M8, M9 may be connected to a bias voltage.

The tenth and eleventh transistors M10, M11 may be connected in series. The tenth and eleventh transistors M10, M11 may comprise n-channel transistors. A drain terminal of the tenth transistor M10 may be connected to the second output node $N_{OUT2}$ and a source terminal of the eleventh transistor M11 may be connected to a reference voltage, such as the ground. A gate terminal of the tenth transistor M10 may be connected to a bias voltage and a gate terminal of the eleventh transistor M11 may be connected to the bias node $B_{COM}$. The second output node $N_{OUT2}$ may also serve as a second output terminal for a second output voltage VOUTP.

The op-amp 105(1) may further comprise a dummy switch 215 to improve the accuracy of an output of the op-amp 105(1). The dummy switch 215 may comprise a transistor, such as an n-channel transistor. According to the present embodiment, the dummy switch 215 is always set to OFF (open) for all operations.

The fourth sub-circuit 235 may comprise a fourth plurality of transistors, such as a twelfth transistor M12, a thirteenth transistor M13, and a fourteenth transistor M14. The twelfth transistor M12 may comprise a p-channel transistor comprising a source terminal connected to the supply voltage VDD and a drain terminal connected to the thirteenth and fourteenth transistors M13, M14. A gate terminal of the twelfth transistor M12 may be connected to a bias voltage.

The thirteenth and fourteenth transistors M13, M14 may be connected in parallel with each other and in series with the twelfth transistor M12. The thirteenth and fourteenth transistors M13, M14 may comprise p-channel transistors. Accordingly, source terminals of the thirteenth and fourteenth transistors M13, M14 may each be connected to the drain terminal of the twelfth transistor M12. A gate terminal of the thirteenth transistor M13 may be connected to a common voltage VCOM and a gate terminal of the fourteenth transistor M14 may be connected to a common mode feedback signal CMFB.

The fourth sub-circuit 235 may further comprise a fifteenth transistor M15 and a sixteenth transistor M16 arranged as a current mirror and connected to the thirteenth and fourteenth transistors M13, M14. The fifteenth and sixteenth transistors M15, M16 may comprise n-channel transistors. Accordingly, a drain terminal of the fifteenth transistor M15 may be connected to a drain terminal of the thirteenth transistor M13 and a drain terminal of the sixteenth transistor M16 may be connected to the a drain terminal of the fourteenth transistor M14. The drain terminal of the sixteenth transistor M16 may also be connected to a gate terminal of the fifteenth transistor M15 and a gate terminal of the sixteenth transistor M16.

The second mode switch 210 may comprise a transistor, such as an n-channel transistor. A drain terminal of the second mode switch 210 may be connected to the fourth sub-circuit 235, a source terminal of the second mode switch 210 may be connected to the bias node $B_{COM}$, and a gate terminal of the second mode switch 210 may be configured to receive the mode signal.

Figure 9:
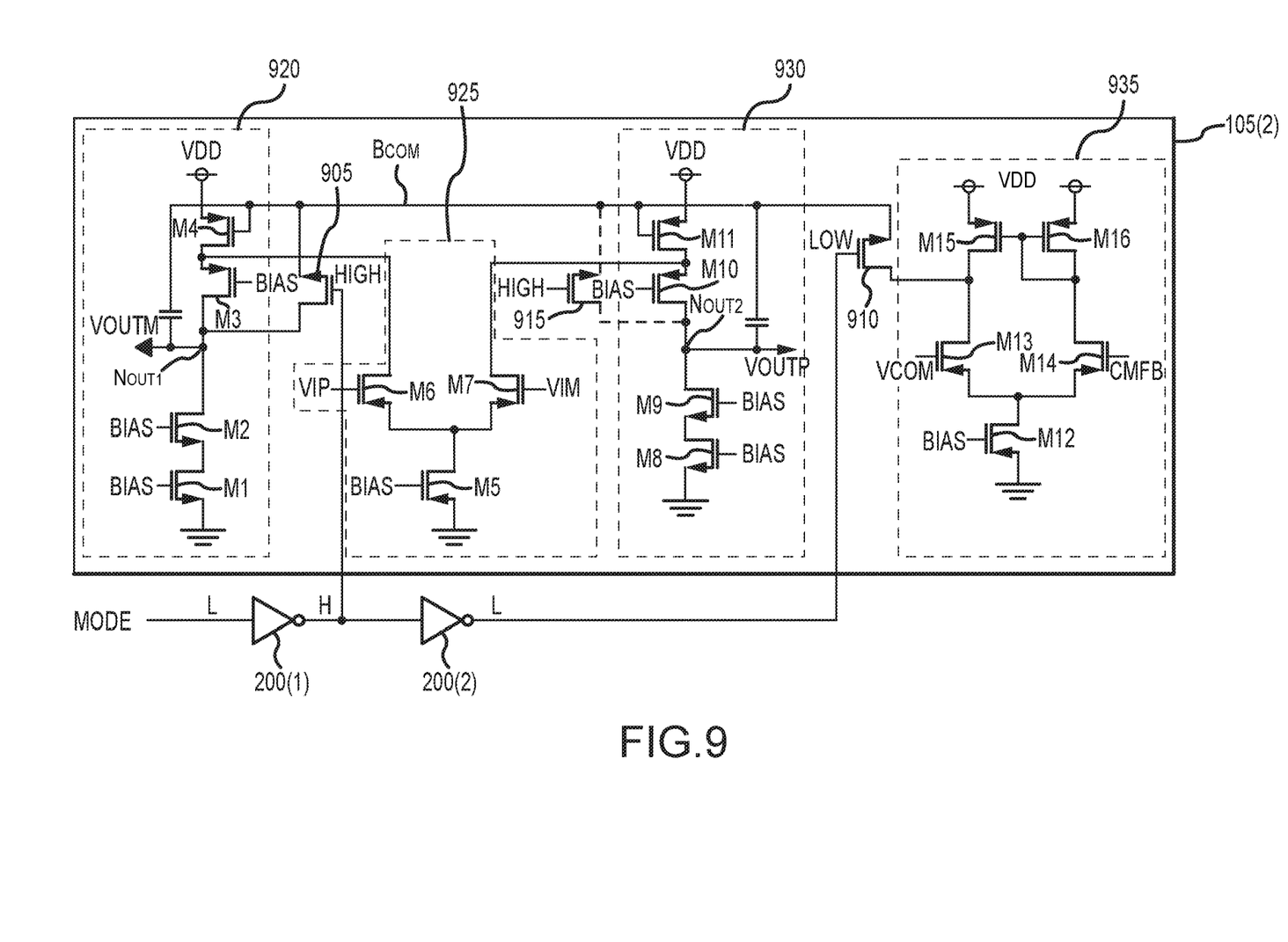
FIG. 9 is a second embodiment of the dual mode operational amplifier in a fully-differential mode in accordance with the present technology.

Referring to FIG. 9, in a second embodiment, the op-amp 105(2) may be configured to operate in both a fully-differential mode and a single-ended mode. For example, the op-amp 105(2) may be configured to receive and respond to a mode signal, such as a high mode signal 'H' (i.e., a high voltage) and a low mode signal 'L' (i.e., a low voltage). According to the present embodiment, the op-amp 105(2) may comprise a plurality of sub-circuits, such as a first sub-circuit 920, a second sub-circuit 925, a third sub-circuit 930, and a fourth sub-circuit 935, that are connected together and configured to amplify an input signal, such as a first input signal VIP and a second input signal VIM. For example, the first, third, and fourth sub-circuits 920, 930, 935 may be directly connected to each other via a bias node $B_{COM}$ and the second sub-circuit 925 may be connected directly to the first and third sub-circuits 920, 930. The op-amp 105(2) may further comprise a plurality of mode switch elements, such as a first mode switch 905 and a second mode switch 910, that are selectively enabled/disabled to operate the op-amp 105(2) in one of the fully-differential mode or the single-ended mode at any given time.

The first sub-circuit 920 may comprise a first plurality of transistors, such as a first transistor M1, a second transistor M2, a third transistor M3, and a fourth transistor M4. The first and second transistors M1, M2 may be connected in series. The first and second transistors M1, M2 may comprise n-channel transistors. A source terminal of the first transistor M1 may be connected to a reference voltage, such as a ground, and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise p-channel transistors. A drain terminal of the third transistor M3 may be connected to the first output node $N_{OUT1}$ and a source terminal of the fourth transistor M4 may be connected to a supply voltage VDD. A gate terminal of the third transistor M3 may be connected to a bias voltage and a gate terminal of the fourth transistor may be connected to the bias node $B_{COM}$. The first output node $N_{OUT1}$ may also serve as a first output terminal for a first output voltage VOUTM.

The first mode switch 905 may comprise a transistor, such as an n-channel transistor. A source terminal of the first mode switch 905 may be connected to the first output node $N_{OUT1}$, a drain terminal of the first mode switch 905 may be connected to the bias node $B_{COM}$, and a gate terminal of the first mode switch 905 may be configured to receive the mode signal.

The second sub-circuit 225 may comprise a second plurality of transistors, such as a fifth transistor M5, a sixth transistor M6, and a seventh transistor M7. The fifth transistor M5 may comprise an n-channel transistor with a source terminal connected to the reference voltage and a drain terminal connected to the sixth and seventh transistors M6, M7. A gate terminal of the fifth transistor may be connected to a bias voltage.

The sixth and seventh transistor M6, M7 may be connected in parallel with each other and in series with the fifth transistor M5. The sixth and seventh transistors M6, M7 may comprise n-channel transistors. Accordingly, source terminals of the sixth and seventh transistors M6, M7 may each be connected to the drain terminal of the fifth transistor M5. A gate terminal of the sixth transistor M6 may be connected to the first input voltage VIP and a gate terminal of the seventh transistor M7 may be connected to the second input voltage VIM. A drain terminal of the sixth transistor M6 may be directly connected to the first sub-circuit 920, for example to the source terminal of the third transistor M3 and the drain terminal of the fourth transistor M4. A drain terminal of the seventh transistor M7 may be directly connected to the third sub-circuit 930.

The third sub-circuit 930 may comprise a third plurality of transistors, such as an eighth transistor M8, a ninth transistor M9, a tenth transistor M10, and an eleventh transistor M11. The eighth and ninth transistors M8, M9 may be connected in series. The eighth and ninth transistors M8, M9 may comprise n-channel transistors. A source terminal of the eighth transistor M8 may be connected to the reference voltage and a drain terminal of the ninth transistor M9 may be connected to a second output node $N_{OUT2}$. Gate terminals of each of the eighth and ninth transistors M8, M9 may be connected to a bias voltage.

The tenth and eleventh transistors M10, M11 may be connected in series. The tenth and eleventh transistors M10, M11 may comprise p-channel transistors. A drain terminal of the tenth transistor M10 may be connected to the second output node $N_{OUT2}$ and a source terminal of the eleventh transistor M11 may be connected to the supply voltage VDD. A gate terminal of the tenth transistor M10 may be connected to a bias voltage and a gate terminal of the eleventh transistor M11 may be connected to the bias node $B_{COM}$. The second output node $N_{OUT2}$ may also serve as a second output terminal for a second output voltage VOUTP.

The op-amp 105(2) may further comprise a dummy switch 915 to improve the accuracy of an output of the op-amp 105(2). The dummy switch 915 may comprise a transistor, such as a p-channel transistor. According to the present embodiment, the dummy switch 915 is always set to ON (closed) for all operations.

The fourth sub-circuit 935 may comprise a fourth plurality of transistors, such as a twelfth transistor M12, a thirteenth transistor M13, and a fourteenth transistor M14. The twelfth transistor M12 may comprise an n-channel transistor with a source terminal connected to the reference voltage and a drain terminal connected to the thirteenth and fourteenth transistors M13, M14. A gate terminal of the twelfth transistor M12 may be connected to a bias voltage.

The thirteenth and fourteenth transistors M13, M14 may be connected in parallel with each other and in series with the twelfth transistor M12. The thirteenth and fourteenth transistors M13, M14 may comprise n-channel transistors. Accordingly, source terminals of the thirteenth and fourteenth transistors M13, M14 may each be connected to the drain terminal of the twelfth transistor M12. A gate terminal of the thirteenth transistor M13 may be connected to a common voltage VCOM and a gate terminal of the fourteenth transistor M14 may be connected to a common mode feedback signal CMFB.

The fourth sub-circuit 1035 may further comprise a fifteenth transistor M15 and a sixteenth transistor M16 arranged as a current mirror and connected to the thirteenth and fourteenth transistors M13, M14. The fifteenth and sixteenth transistors M15, M16 may comprise p-channel transistors. Accordingly, a drain terminal of the fifteenth transistor M15 may be connected to a drain terminal of the thirteenth transistor M13 and a drain terminal of the sixteenth transistor M16 may be connected to the a drain terminal of the fourteenth transistor M14. The drain terminal of the sixteenth transistor M16 may also be connected to a gate terminal of the fifteenth transistor M15 and a gate terminal of the sixteenth transistor M16.

The second mode switch 910 may comprise a transistor, such as a p-channel transistor. A drain terminal of the second mode switch 910 may be connected to the fourth sub-circuit 935, a source terminal of the second mode switch 910 may be connected to the bias node $B_{COM}$, and a gate terminal of the second mode switch 910 may be configured to receive the mode signal.

Figure 10:
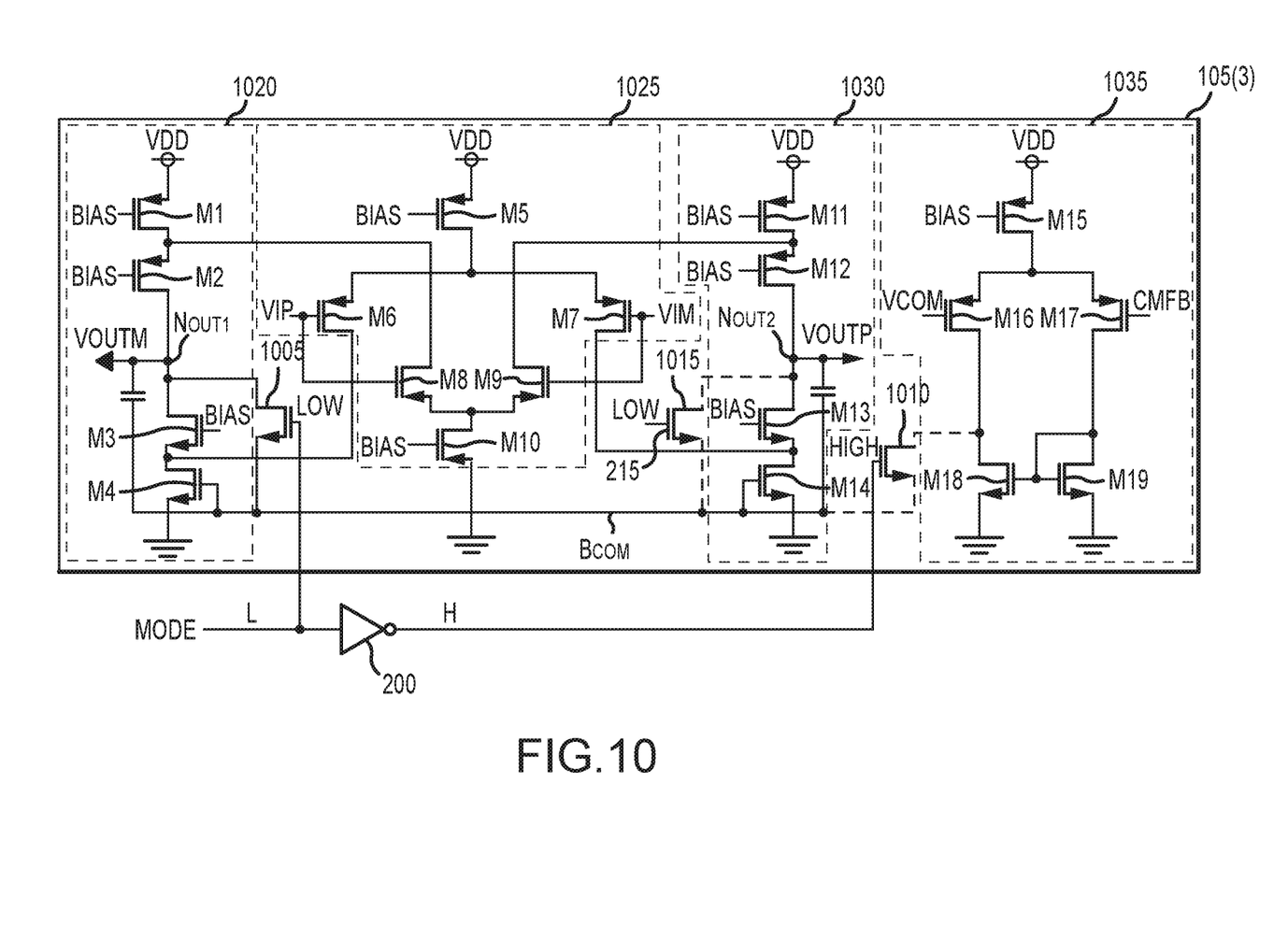
FIG. 10 is a third embodiment of the dual mode operational amplifier in a fully-differential mode in accordance with the present technology.

Referring to FIG. 10, in a third embodiment, the op-amp 105(3), may be configured to operate in both a fully-differential mode and a single-ended mode. For example, the op-amp 105(3) may be configured to receive and respond to a mode signal, such as a high mode signal 'H' (i.e., a high voltage) and a low mode signal (i.e., a low voltage). According to the present embodiment, the op-amp 105(3) may comprise a plurality of sub-circuits, such as a first sub-circuit 1020, a second sub-circuit 1025, a third sub-circuit 1030, and a fourth sub-circuit 1035, which are connected together and configured to amplify an input signal, such as a first input signal VIP and a second input signal VIM. For example, the first, third, and fourth sub-circuits 1020, 1030, 1035 may be directly connected to each other via a bias node $B_{COM}$ and the second sub-circuit 1025 may be connected directly to the first and third sub-circuits 1020, 1030. The op-amp 105(3) may further comprise a plurality of mode switch elements, such as a first mode switch 1005 and a second mode switch 1010, that are selectively enabled/disabled to operate the op-amp 105(3) in one of the fully-differential mode or the single-ended mode at any given time.

The first sub-circuit 1020 may comprise a first plurality of transistors, such as a first transistor M1, a second transistor M2, a third transistor M3, and a fourth transistor M4. The first and second transistors M1, M2 may be connected in series. The first and second transistors M1, M2 may comprise p-channel transistors. A source terminal of the first transistor M1 may be connected to a supply voltage VDD and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise n-channel transistors. A drain terminal of the third transistor M3 may be connected to the first output node $N_{OUT1}$ and a source terminal of the fourth transistor M4 may be connected to a reference voltage, such as a ground. A gate terminal of the third transistor M3 may be connected to a bias voltage and a gate terminal of the fourth transistor may be connected to the bias node $B_{COM}$. The first output node $N_{OUT1}$ may also serve as a first output terminal for a first output voltage VOUTM.

The first mode switch 1005 may comprise a transistor, such as an n-channel transistor. A drain terminal of the first mode switch 1005 may be connected to the first output node $N_{OUT1}$, a source terminal of the first mode switch 1005 may be connected to the bias node $B_{COM}$, and a gate terminal of the first mode switch 1005 may be configured to receive the mode signal.

The second sub-circuit 1025 may comprise a plurality of transistors, such as a fifth transistor M5, a sixth transistor M6, and a seventh transistor M7. The fifth transistor M5 may comprise a p-channel transistor comprising a source terminal connected to the supply voltage VDD and a drain terminal connected to the sixth and seventh transistors M6, M7. A gate terminal of the fifth transistor may be connected to a bias voltage.

The sixth and seventh transistor M6, M7 may be connected in parallel with each other and in series with the fifth transistor M5. The sixth and seventh transistors M6, M7 may comprise p-channel transistors. Accordingly, source terminals of the sixth and seventh transistors M6, M7 may each be connected to the drain terminal of the fifth transistor M5. A gate terminal of the sixth transistor M6 may be connected to the first input voltage VIP and a gate terminal of the seventh transistor M7 may be connected to the second input voltage VIM. A source terminal of the sixth transistor M6 may be directly connected to the first sub-circuit 1020, for example to the source terminal of the third transistor M3 and the drain terminal of the fourth transistor M4. A source terminal of the seventh transistor M7 may be directly connected to the third sub-circuit 230.

The second sub-circuit 1025 may further comprise an eight transistor M8, a ninth transistor M9, and a tenth transistor M10, wherein M8, M9 and M10 comprise n-channel transistors. A gate terminal of the eight transistor M8 is connected to the first input voltage VIP and a drain terminal is connected to the first sub-circuit 1020, for example between the first and second transistors M1, M2. A gate terminal of the ninth transistor M9 is connected to the second input voltage VIM and a drain terminal is connected to the third sub-circuit 1030. Source terminals of the eighth and ninth transistors M8, M9 are connected to a drain terminal of tenth transistor M10. A source terminal of the tenth transistor M10 may be connected to the reference voltage.

The third sub-circuit 1030 may comprise a third plurality of transistors, such as an eleventh transistor M11, a twelfth transistor M12, a thirteenth transistor M13, and a fourteenth transistor M14. The eleventh and twelfth transistors M11, M12 may be connected in series. The eleventh and twelfth transistors M11, M12 may comprise p-channel transistors. A source terminal of the eleventh transistor M11 may be connected to the supply voltage VDD and a drain terminal of the twelfth transistor M12 may be connected to a second output node $N_{OUT2}$. Gate terminals of each of the eleventh and twelfth transistors M11, M12 may be connected to a bias voltage.

The thirteenth and fourteenth transistors M13, M14 may be connected in series. The thirteenth and fourteenth transistors M13, M14 may comprise n-channel transistors. A drain terminal of the thirteenth transistor M13 may be connected to the second output node $N_{OUT2}$ and a source terminal of the fourteenth transistor M14 may be connected to a reference voltage, such as the ground. A gate terminal of the thirteenth transistor M13 may be connected to a bias voltage and a gate terminal of the fourteenth transistor M14 may be connected to the bias node $B_{COM}$. The second output node $N_{OUT2}$ may also serve as a second output terminal for a second output voltage VOUTP.

The op-amp 105(3) may further comprise a dummy switch 1015 to improve the accuracy of an output of the op-amp 105(3). The dummy switch 1015 may comprise a transistor, such as an n-channel transistor. According to the present embodiment, the dummy switch 1015 is always set to OFF (open) for all operations.

The fourth sub-circuit 1035 may comprise a fourth plurality of transistors, such as a fifteenth transistor M15, a sixteenth transistor M16, and a seventeenth transistor M17. The fifteenth transistor M15 may comprise a p-channel transistor with a source terminal connected to the supply voltage VDD and a drain terminal connected to the sixteenth and seventeenth transistors M16, M17. A gate terminal of the fifteenth transistor M15 may be connected to a bias voltage.

The sixteenth and seventeenth transistors M16, M17 may be connected in parallel with each other and in series with the fifteenth transistor M15. The sixteenth and seventeenth transistors M16, M17 may comprise p-channel transistors. Accordingly, source terminals of the sixteenth and seventeenth transistors M16, M17 may each be connected to the drain terminal of the fifteenth transistor M15. A gate terminal of the sixteenth transistor M16 may be connected to a common voltage $V_{COM}$ and a gate terminal of the seventeenth transistor M17 may be connected to a common mode feedback signal CMFB.

The fourth sub-circuit 1035 may further comprise an eighteenth transistor M18 and a nineteenth transistor M19 arranged as a current mirror and connected to the sixteenth and seventeenth transistors M16, M17. The eighteenth and nineteenth transistors M18, M19 may comprise n-channel transistors. Accordingly, a drain terminal of the eighteenth transistor M18 may be connected to a drain terminal of the sixteenth transistor M16 and a drain terminal of the nineteenth transistor M19 may be connected to the a drain terminal of the seventeenth transistor M17. The drain terminal of the nineteenth transistor M19 may also be connected to a gate terminal of the eighteenth transistor M18 and a gate terminal of the nineteenth transistor M19.

The second mode switch 1010 may comprise a transistor, such as an n-channel transistor. A drain terminal of the second mode switch 1010 may be connected to the fourth sub-circuit 1035, a source terminal of the second mode switch 1010 may be connected to the bias node $B_{COM}$, and a gate terminal of the second mode switch 1010 may be configured to receive the mode signal.

Referring to FIGS. 1, 2, 3, 9, and 10, the sensor system 100 may further comprise a control circuit 125 configured to generate the mode signal ('H' and 'L') according to the desired mode operation. For example, the control circuit 125 may generate the high mode signal ('H') to operate the op-amp 105 in the single-ended mode and may generate the low mode signal ('L') to operate the op-amp 105 in the fully-differential mode. The control circuit 125 may comprise various logic gates and/or other circuitry suitable for generating a digital signal. The control circuit 125 may be further configured to generate various switch signals (SW) to selectively operate the plurality of switches SW1A:SW6A and SW1B:SW8B (FIG. 1) through one or more signal paths.

The control circuit 125 may comprise or operate in conjunction with an inverter 200. The inverter 200 may be configured to receive the mode signal at an input terminal and output a signal having an opposite logic-level. For example, when the inverter 200 receives a low mode signal 'L' (i.e., low voltage), it outputs a high mode signal (i.e., high voltage), and when the inverter 200 receives a high mode signal, it outputs a low mode signal. The inverter may comprise a logic gate, such as a NOT gate, for implementing logical negation.

Alternatively, the inverter 200 may be integrated within the op-amp 105 or the amplifier 120.

The ADC 110 may be configured to convert an analog signal into a digital signal. For example, the ADC 110 may be connected to an output terminal of the amplifier circuit 120. In an exemplary embodiment, the ADC 110 may be connected to receive the second output voltage VOUTP.

According to an exemplary embodiment, the op-amp 105 functions as both a single-ended op-amp and a fully-differential op-amp. Accordingly, the op-amp 105 is capable of operating in both the single-ended mode and the fully-differential mode. In an exemplary operation, and referring to FIGS. 2-8, the amplifier circuit 120 may enter a first reset state (RESET 1). During the first reset state, switches SW1A,B, SW3A,B, SW5A,B, SW6A,B, and SW8B are ON; switches SW2A,B, SW4A,B, and SW7 are OFF; and the mode signal is set to low 'L'.

Figure 6:
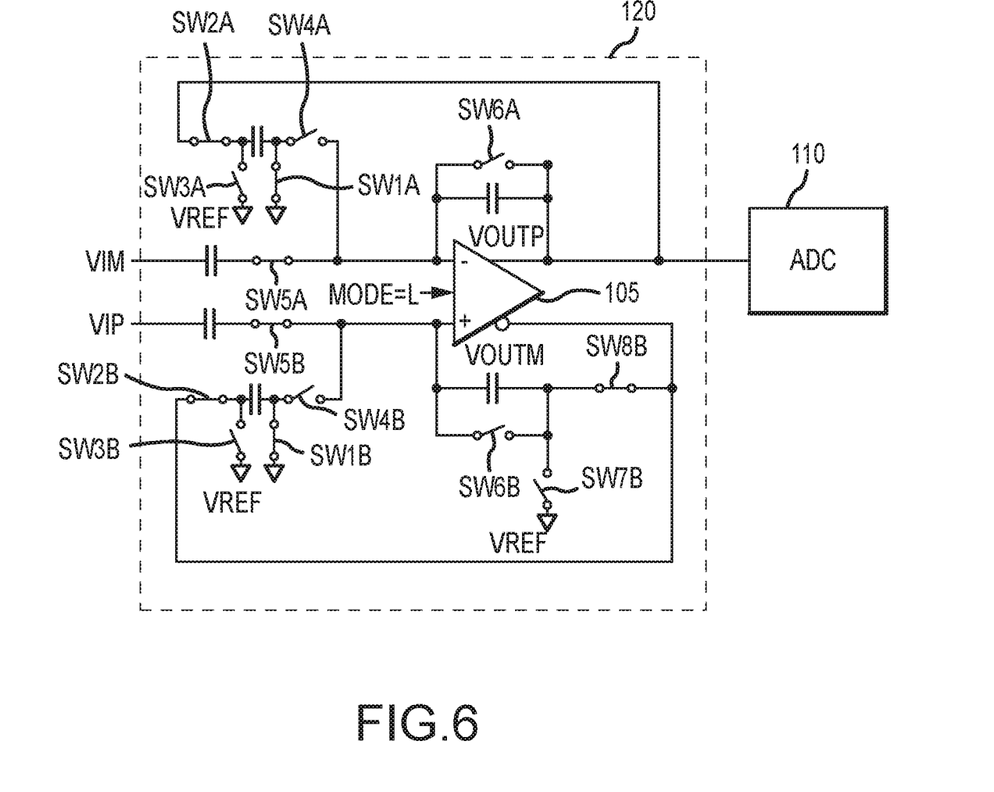
FIG. 6 is the amplifier circuit in the fully-differential mode in accordance with an exemplary embodiment of the present technology.

During the fully-differential mode, which immediately follows the first reset state, switches SW1A,B remain ON, switches SW2A,B are turned ON, switches SW3A,B are turned OFF, switches SW4A,B remain OFF, switches SW6A,B are turned OFF, switch SW7 remains OFF, switch SW8B remains ON, and the mode signal remains low.

Figure 7:
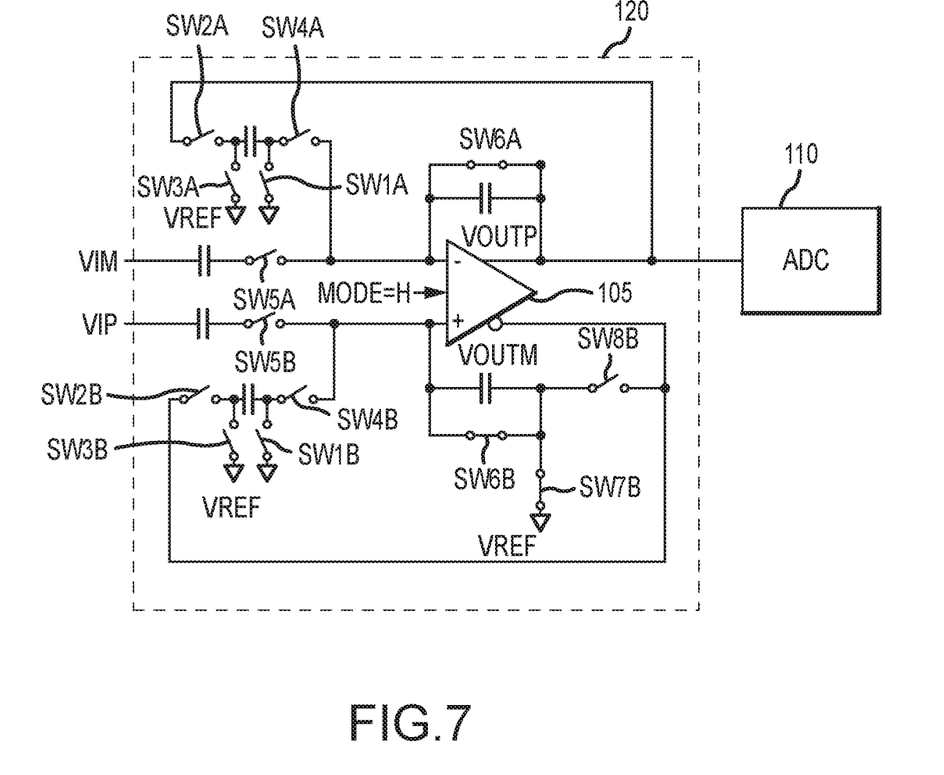
FIG. 7 is the amplifier circuit in a second reset phase in accordance with an exemplary embodiment of the present technology.

During a second reset state (RESET 2), which immediately follows the fully-differential mode, the mode signal is set to high 'H', switches SW1A,B are turned OFF, switches SW2A,B are turned OFF, switches SW3A,B remain OFF, switches SW4A,B remain OFF, switches SW5A,B are turned OFF, switches SW6A,B are turned ON, switch SW7B is turned ON, and switch SW8B is turned OFF.

Figure 8:
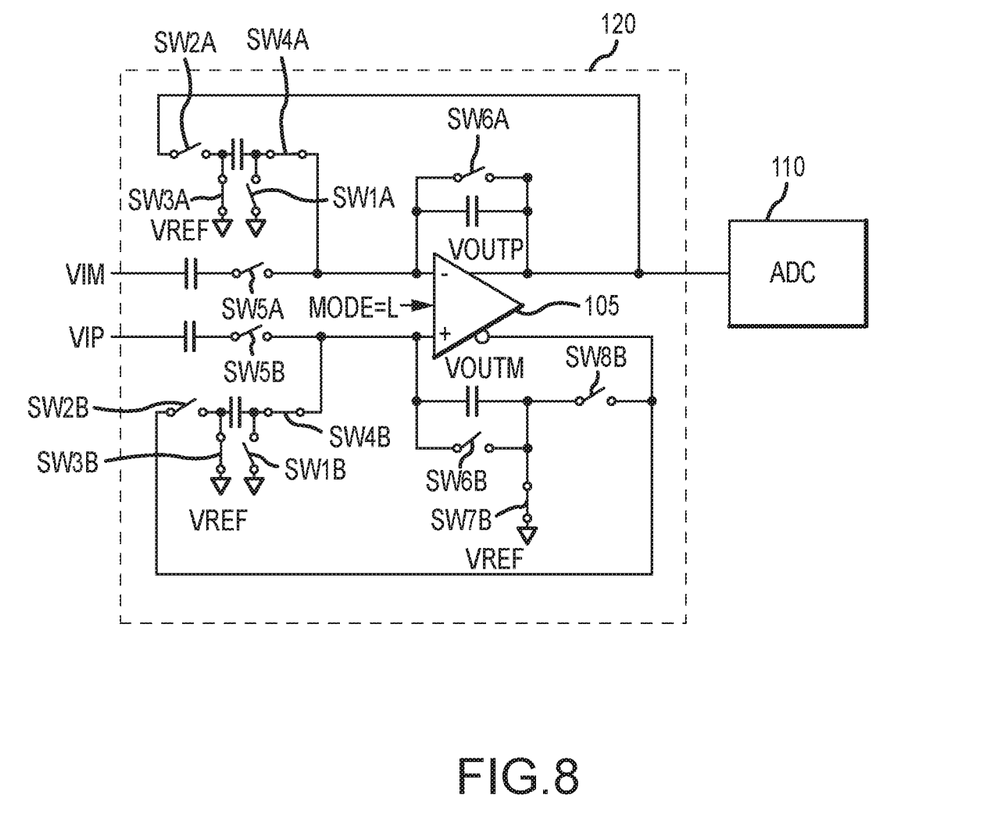
FIG. 8 is the amplifier circuit in the single-ended mode in accordance with an exemplary embodiment of the present technology.

During the single-ended mode, which immediately follows the second reset state, the mode signal remains high, switches SW1A,B and SW2A,B remain OFF, switches SW3A,B are turned ON, switches SW4A,B are turned ON, switches SW5A,B remain OFF, switches SW6A,B are turned OFF, switch SW7B remains ON, and switch SW8B remains OFF.

During the fully-differential mode and when the mode signal is low ('L'), the first mode switch 205 receives a low signal, which turns the first mode switch 205 OFF, and the second mode switch 210 receives a high signal via the inverter 200, which turns the second mode switch ON.

During the single-ended mode and when the mode signal is high ('H'), the first mode switch 205 receive a high signal, which turns the first mode switch ON, and the second mode switch 210 receives a low signal via the inverter 200, which turns the second mode switch OFF.

It will be understood by those of ordinary skill in the art that the transistors may be implemented as either p-channel transistors or n-channel transistors. As such, the operation of the transistors may change accordingly. For example, the first and second mode switches 205, 210 may be implemented as p-channel transistors. In such a case, a high mode signal would turn the switch OFF and a low mode signal would turn the switch ON.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An operational amplifier, comprising:
   a first sub-circuit connected to a supply voltage and a bias node, and comprising:
      a first transistor connected in series with a second transistor;
      a third transistor connected in series with the second transistor; and
      a first node positioned between the second and third transistors;
   a first mode switch configured to selectively connect the first node to the bias node;
   a second sub-circuit connected to the first sub-circuit;
   a third sub-circuit connected to:
      the supply voltage; and
      the bias node;
   a fourth sub-circuit directly connected to the supply voltage; and
   a second mode switch configured to selectively connect the fourth sub-circuit to the bias node;
   wherein the operational amplifier operates in a fully-differential mode and a single-ended mode according to the first and second mode switches.

2. The operational amplifier according to claim 1, wherein:
   during the fully-differential mode, the first mode switch is OFF and the second mode switch is ON; and
   during the single-ended mode, the first mode switch is ON and the second mode switch is OFF.

3. The operational amplifier according to claim 1, wherein the fourth sub-circuit comprises:
   a fourth transistor directly connected to the supply voltage;
   a pair of transistors comprising a fifth transistor connected in parallel with a sixth transistor, wherein the pair of transistors is connected in series with the fourth transistor;
   a current mirror circuit connected to the pair of transistors; and
   a second node positioned between the fifth transistor and the current mirror circuit.

4. The operational amplifier according to claim 3, wherein the second mode switch is connected to the bias node and the second node.

5. The operational amplifier according to claim 1, wherein the first mode switch is responsive to a first mode signal and the second mode switch is responsive to a second mode signal.

6. The operational amplifier according to claim 5, wherein the second mode signal is the inverse of the first mode signal.

7. The operational amplifier according to claim 5, wherein each of the first and second mode signals comprise a low signal and a high signal.

8. The operational amplifier according to claim 7, wherein the operational amplifier operates in a first mode when the first mode switch receives the low signal and the second mode switch receives the high signal.

9. The operational amplifier according to claim 8, wherein the operational amplifier operates in a second mode when the first mode switch receives the high signal and the second mode switch receives the low signal.

10. The operational amplifier according to claim 9, wherein:
    the first mode comprises the fully-differential mode; and
    the second mode comprises the single-ended mode.

11. A method for operating a dual mode operational amplifier, comprising:
    receiving an input voltage at an input terminal of the operational amplifier, wherein the operational amplifier comprises:
       a plurality of sub-circuits comprising: a first sub-circuit, a second sub-circuit, a third sub-circuit, and a fourth sub-circuit; and
       a first mode switch and a second mode switch;
    generating a mode signal, wherein:
       the mode signal comprises a first mode signal and a second mode signal, and
       the first mode signal corresponds to a fully-differential mode and the second mode signal corresponds to a single-ended mode;
    supplying the mode signal to the operational amplifier; and
    selectively connecting the fourth sub-circuit directly to the remaining sub-circuits from the plurality of sub-circuits via the second mode switch and according to the mode signal.

12. The method according to claim 11, further comprising selectively operating a plurality of switches to perform a reset operation.

13. The method according to claim 11, further comprising generating a first output voltage and a second output voltage with the operational amplifier according to the mode signal.

14. The method according to claim 11, wherein the first mode signal applies a low voltage to the first mode switch and a high voltage to the second mode switch.

15. The method according to claim 11, wherein the second mode signal applies a high voltage to the first mode switch and a low voltage to the second mode switch.

16. A system, comprising:
    a sensor;
    an operational amplifier connected to the sensor and configured to operate in a fully-differential mode and a single-ended mode and comprising:
       a first sub-circuit connected to a supply voltage and a bias node, and comprising a first node, wherein the first sub-circuit outputs a first output voltage at the first node;

a first mode switch configured to selectively connect the first node to the bias node;

a second sub-circuit connected to the first sub-circuit;

a third sub-circuit connected to the supply voltage and the bias node, and comprising a second node, wherein the third sub-circuit outputs a second output voltage at the second node;

a fourth sub-circuit connected to the supply voltage; and a second mode switch configured to selectively connect the fourth sub-circuit directly to the bias node;

an analog-to-digital converter configured to receive the second output voltage; and a control circuit configured to generate a mode signal and transmit the mode signal to the operational amplifier, wherein the mode signal comprises:

a first mode signal that corresponds to the fully-differential mode; and a second mode signal that corresponds to the single-ended mode.

17. The system according to claim 16, wherein each of the first and second mode switches comprise an n-channel transistor comprising a gate terminal configured to receive the mode signal.

18. The system according to claim 16, wherein the first mode signal results in:

the first mode switch receiving a low voltage; and the second mode switch receiving a high voltage.

19. The system according to claim 16, wherein the second mode signal results in:

the first mode switch receiving a high voltage; and the second mode switch receiving a low voltage.

20. The system according to claim 16, further comprising an inverter configured to receive the mode signal and generate a signal with an opposite logic level than that of the mode signal.

* * * * *